United States Patent [19]
Terletzki

[11] Patent Number: 5,939,937
[45] Date of Patent: Aug. 17, 1999

[54] CONSTANT CURRENT CMOS OUTPUT DRIVER CIRCUIT WITH DUAL GATE TRANSISTOR DEVICES

[75] Inventor: Hartmud Terletzki, Pleasant Valley, N.Y.

[73] Assignee: Siemens Aktiengesellschaft, Munich, Germany

[21] Appl. No.: 08/940,862

[22] Filed: Sep. 29, 1997

[51] Int. Cl.$^6$ ................................. G05F 1/10; G05F 3/02
[52] U.S. Cl. ............................................ 327/541; 327/437
[58] Field of Search .................................... 327/108, 112, 327/427, 434, 437, 538, 581, 566, 540–545; 326/82–85, 87, 33, 34, 73, 74

[56] References Cited

U.S. PATENT DOCUMENTS

| | | | |
|---|---|---|---|
| 4,782,250 | 11/1988 | Adams et al. | 307/473 |
| 5,144,165 | 9/1992 | Dhong et al. | 307/451 |
| 5,151,619 | 9/1992 | Austin et al. | 307/473 |
| 5,206,544 | 4/1993 | Chen et al. | 307/443 |
| 5,414,314 | 5/1995 | Thurber, Jr. | 327/427 |
| 5,430,387 | 7/1995 | Bechade et al. | 326/27 |
| 5,434,519 | 7/1995 | Trinh et al. | 326/83 |
| 5,440,258 | 8/1995 | Galbi et al. | 327/112 |
| 5,453,705 | 9/1995 | Atallah et al. | 326/86 |
| 5,495,184 | 2/1996 | Des Rosiers et al. | 326/73 |
| 5,629,634 | 5/1997 | Carl et al. | 326/27 |
| 5,635,861 | 6/1997 | Chan et al. | 326/81 |
| 5,668,488 | 9/1997 | Sharpe-Geisler et al. | 327/108 |

*Primary Examiner*—My-Trang Nu Ton
*Attorney, Agent, or Firm*—Stanton C. Braden

[57] ABSTRACT

An output driver circuit having an output coupled to a resistive termination load comprises: a dual gate pFET device including source and drain transistors, each transistor respectively having a gate, source, and drain, the source transistor source coupled to a voltage source V, the source transistor drain coupled to the drain transistor source, the drain transistor drain coupled to the output of the driver circuit; a dual gate nFET device including source and drain transistors, each transistor respectively having a gate, source and drain, the source transistor source coupled to a ground potential, the source transistor drain coupled to the drain transistor source, the drain transistor drain coupled to the output of the driver circuit; first and second switches, coupled to the source transistor gate of the pFET device and the nFET device, respectively, for turning on and off current flow from the voltage source V through the source transistor of the pFET device and to the ground potential through the source transistor of the nFET device, respectively; and a bias generator having first and second outputs coupled to the drain transistor gate of the pFET and nFET devices, respectively, and providing first and second bias voltages to the respective drain transistor which are a function of a reference voltage associated with the load and which substantially and respectively control the amount of current provided by the drain transistor of the pFET device to the load and by the load to the drain transistor of the nFET device.

28 Claims, 8 Drawing Sheets

CONSTANT CURRENT CMOS OUTPUT DRIVER CIRCUIT WITH DUAL GATE TRANSISTOR DEVICES

BACKGROUND OF THE INVENTION

1. Field of the Invention

The present invention relates to data transfer between semiconductor devices and, more particularly, relates to drain current controlled CMOS output driver circuits for constant current applications.

2. Description of the Prior Art

It is known that in high frequency data transfer applications, such data transfer is typically accomplished with transmission lines and terminal resistors in order to avoid signal reflections which may cause distortion and/or ringing on input/output signals. Particularly, a termination resistor may be located at either the end, or both at the end and the beginning, of the transmission line. The value of such termination resistor(s) is not fixed; however, typical values may be 50, 60, 75 or 100 ohms. It is to be appreciated that such termination resistor(s) may be connected to ground, to the device power supply, or to an externally provided reference voltage as disclosed in the Stub Series Terminated Logic (SSTL) EIA/JEDEC Standard.

Figure 1:
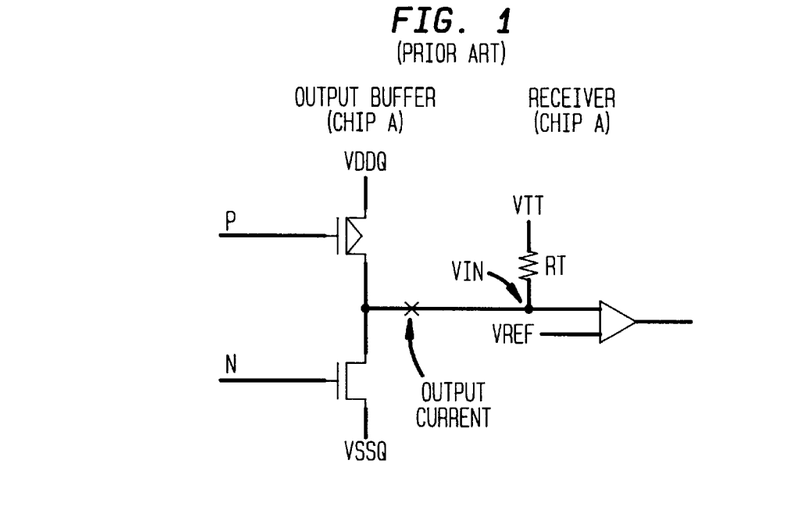
FIG. 1 is a conventional high frequency application data transfer system employing an external termination resistor.

By way of example, FIG. 1 illustrates an off chip driver (OCD) circuit located in Chip A and referred to as an output buffer. A typical application of an OCD is to drive output data bits from a semiconductor memory device, such as a dynamic random access memory (DRAM) device, to another device (receiver). Such an OCD typically must deliver a specified voltage swing at an input stage of the device receiving the data bits in order to ensure proper operation of the data transfer system. In order to ensure such a specified voltage swing, it would be advantageous for the OCD to provide a controllable current source (p-channel transistor) and current sink (n-channel transistor). In such a case, the controlled current causes a voltage drop across the termination resistor RT which is used as the input voltage VIN of an input circuit (Receiver/Chip B).

Attempts have been made to develop output current controlled driver circuits.

For instance, U.S. Pat. No. 5,495,184 (Des Rosiers et al.), issued Feb. 7, 1996, discloses a high-speed low-power CMOS positive-shifted ECL I/O transmitter.

The transmitter contains a totem-pole structure of four CMOS transistors. The top two CMOS transistors are PMOS devices and the bottom two transistors are NMOS devices. The top and bottom transistors function as output current switches which alternatively turn on and off the current flow from either a source voltage power supply VSS or a drain voltage power supply VDD to a resistive termination load Rt.

The middle two devices are connected to DC voltage references which control a precise amount of current sourced to a load using a precision current source and sunk from a load using a precision current sink. The reference voltages for the precision current source and the current sink use a negative feedback circuit which is referenced to a resistor ladder and a current source controlled by a band-gap reference source. The arrangement in the Des Rosiers et al. transmitter allows for on-chip referencing of ECL levels and control of reference voltages and currents in spite of variation in process, voltage, and temperature. Internal ECL reference level signals VOL and VOH are used to control the output levels. Operational amplifiers drive the respective transistors such that voltage at the drains of the current source and sink transistors equals the ECL reference inputs VOH and VOL. These control voltages generate a precise current through a replica stage and are also applied to the output stage. All of the devices in the reference control circuit are scaled to reduce DC power dissipation.

However, the DC voltage references generated by the Des Rosiers et al. transmitter, which control the current sourced to the load and sunk from a load disadvantageously do not take into account the external reference voltage coupled to the resistive termination load Rt. As a result, the Des Rosiers et al. output driver's applicability to various data transfer standards is severely limited.

SUMMARY OF THE INVENTION

In one aspect of the invention, an output driver circuit having an output terminal operatively coupled to a resistive termination load comprises: a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit; a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit; first switching means, operatively coupled to the gate terminal of the source transistor of the dual gate pFET device, for turning on and off current flow from the voltage source V through the source transistor of the dual gate pFET device; second switching means, operatively coupled to the gate terminal of the source transistor of the dual gate nFET device, for turning on and off current flow to the ground potential through the source transistor of the dual gate nFET device; and bias generating means having a first output terminal operatively coupled to the gate terminal of the drain transistor of the dual gate pFET device and providing a first bias voltage to the drain transistor which is a function of a reference voltage associated with the resistive termination load and which substantially controls the amount of current provided by the drain transistor of the dual gate pFET device to the resistive termination load, the bias generating means also having a second output terminal operatively coupled to the gate terminal of the drain transistor of the dual gate nFET device and providing a second bias voltage to the drain transistor which is a function of the reference voltage associated with the resistive termination load and which substantially controls the amount of current provided by the resistive termination load to the drain transistor of the dual gate nFET device.

In another aspect of the invention, an output driver circuit having an output terminal operatively coupled to a resistive termination load comprises: a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit; a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit; first switching means, operatively coupled to the gate terminal of the drain transistor of the dual gate pFET device, for turning on and off current flow from the source transistor of the dual gate pFET device; second switching means, operatively coupled to the gate terminal of the drain transistor of the dual gate nFET device, for turning on and off current flow to the source transistor of the dual gate nFET device; and bias generating means having a first output terminal operatively coupled to the gate terminal of the source transistor of the dual gate pFET device and providing a first bias voltage to the source transistor which is a function of a reference voltage associated with the resistive termination load and which substantially controls the amount of current provided to and through the drain transistor of the dual gate pFET device to the resistive termination load, the bias generating means also having a second output terminal operatively coupled to the gate terminal of the source transistor of the dual gate nFET device and providing a second bias voltage to the source transistor which is a function of the reference voltage associated with the resistive termination load and which substantially controls the amount of current provided by the resistive termination load to and through the drain transistor of the dual gate nFET device.

It is to be appreciated that the bias voltage generator preferably includes current mirror circuit arrangements and multi-stage circuit arrangements for generating the bias voltages employed to substantially control the amount of current sourced and sunk by the output driver circuits of the present invention. Preferred embodiments of such bias generating means, as well as preferred embodiments of the output driver circuit, will be explained in detail herein.

Advantageously, the present invention provides a drain current controlled CMOS output driver circuit for constant current applications (preferably employed as an off chip driver, OCD, in a semiconductor memory device) in which an external resistive termination load is used, e.g., SSTL_2, SSTL_3, HSTL, ECL. The drain current in the pull-up path (sourced by the dual gate pFET device) and the pull-down path (sunk by the dual gate nFET device) are respectively controlled by the gate bias voltages generated by the circuit of the invention which advantageously takes into account an external termination reference voltage.

These and other objects, features and advantages of the present invention will become apparent from the following detailed description of illustrative embodiments thereof, which is to be read in connection with the accompanying drawings.

DETAILED DESCRIPTION OF INVENTION

Figure 2:
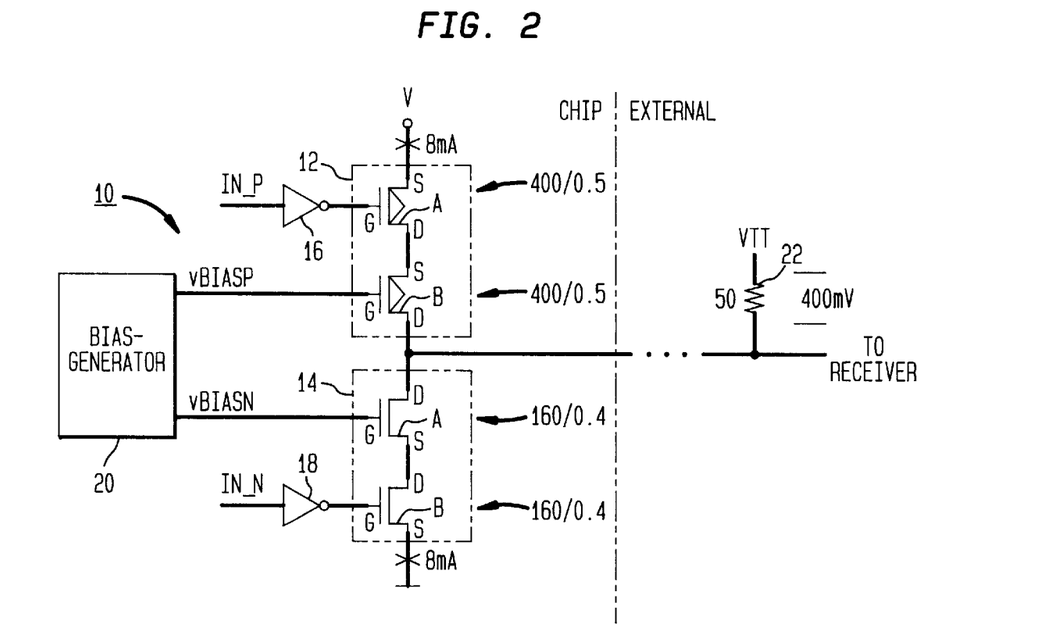
FIG. 2 is a schematic diagram of one embodiment of an output driver circuit of the present invention.

Referring initially to FIG. 2, a first embodiment of an output driver circuit according to the invention for providing constant drain current control to a resistive termination load is illustrated. It is to be appreciated that the output driver circuit of the invention is preferably employed as an off chip driver (OCD) in a semiconductor memory device, e.g, a DRAM device; however, the invention is not so limited and such a unique output driver circuit may be employed in various other data transfer applications contemplated by those skilled in the art. The dashed line in FIG. 2 delineating the terms "chip" and "external" is intended to indicate that the output driver circuit is formed as a portion of the chip or semiconductor device from which data is to be driven. Components on the other side of the dashed line are therefore external to the chip and thus the output driver circuit of the invention.

Specifically, the output driver circuit 10 includes a dual gate p-channel field effect transistor (pFET) device 12 forming a pull-up path of the output driver circuit. The dual gate pFET device 12, itself, includes a source transistor 12A and a drain transistor 12B, each having a source terminal (S), a gate terminal (G), and a drain terminal (D). The source terminal of the source transistor 12A is connected to a voltage source V externally provided to the chip (i.e., chip power supply). The drain terminal of the drain transistor 12B is connected to the output terminal of the output driver circuit 10.

The output driver circuit 10 also includes a dual gate n-channel field effect transistor (nFET) device 14 forming a pull-down path of the output driver circuit. The dual gate nFET device 14, itself, includes a drain transistor 14A and a source transistor 14B, each having a source terminal (S), a gate terminal (G), and a drain terminal (D).

The source terminal of the source transistor 14B is connected to a ground potential.

Further, the drain terminal of the source transistor 14B is connected to the source terminal of the drain transistor 14A. The drain terminal of the drain transistor 14A is connected to the output terminal of the output driver circuit 10.

The gate terminal of the source transistor 12A of the pFET device is connected to an output terminal of a switching inverter 16, while the gate terminal of the source transistor 14B of the nFET device is connected to an output terminal of a switching inverter 18. The switching device 16, in response to p-channel input signal IN_P, is used to turn on and off the source transistor 12A thereby turning on and off current flow from the voltage source V through the source transistor 12A of the dual gate pFET device. Similarly, the switching device 18, in response to n-channel input signal IN_N, is used to turn on and off the source transistor 14B thereby turning on and off current flow to the ground potential through the source transistor 14B of the dual gate nFET device.

The gate terminal of the drain terminal 12B of the pFET device is connected to a first output terminal of a bias generator 20. Bias generator 20 generates bias voltage vBIASP, as will be explained in detail below, and provides vBIASP to the gate terminal of the drain transistor 12B in order to substantially control the amount of current provided by the drain transistor 12B of the pFET device. Similarly, the gate terminal of the drain terminal 14A of the nFET device is connected to a second output terminal of the bias generator 20. Bias generator 20 generates bias voltage vBIASN, as will be explained in detail below, and provides vBIASN to the gate terminal of the drain transistor 14A in order to substantially control the amount of current provided to the drain transistor 14A of the nFET device.

The output terminal of the output driver circuit 10, formed at the junction of the drain terminals of the drain transistors 12B and 14A, is connected to a first terminal of a termination resistor 22, while the second terminal of the termination resistor 22 is connected to an external reference voltage source VTT. The output terminal of the output driver circuit 10 is also connected to the input of the device (not shown) receiving the data from the circuit 10. Given such preferred connectivity between components, the operation of the output driver circuit 10 will now be explained.

The output driver circuit of the present invention delivers constant current both for the pFET pull-up path and the nFET pull-down path while simultaneously permitting the internal (chip) power supply voltages and the external reference voltage to vary within a certain permissible range. It is to be appreciated that the drain current of CMOS transistors, such as the transistors 12A, 12B, 14A and 14B (and all other transistors disclosed herein), is substantially controlled by the gate to source voltage. Thus, by generating gate voltages (e.g., vBIASP and vBIASN) in accordance with the invention and respectively applying such voltages to the gate terminals of the drain transistors (or source transistors, as will be explained in an alternative embodiment), the drain current of each path (pull-up and pull-down) may advantageously be controlled such that a constant current is provided therethrough. The source transistors, in this particular embodiment, are used to effectively enable and disable the pull-up and pull-down paths (whereas, in an alternative embodiment, the drain transistors provide this function, as will be explained).

By way of example, the termination resistor 22 is illustrated as having a value of 50 ohms. The value of the termination resistor is chosen to correspond to the current to be sourced/sunk by the output driver circuit and to the input voltage of the receiver. Thus, in accordance with the example shown in FIG. 2, a 50 ohm termination resistor will result in a constant current of about 8 milliamps (mA) at the output terminal of the output driver circuit thus causing a voltage drop of about +/−400 millivolts (mV) at the input to the receiver. In this example, +/−400 mV is the input voltage required by the receiver.

Accordingly, when signal IN_P is a logic high (about 5 volts) and thus signal IN_N is also a logic high, the switching inverter 16 outputs a logic low (about 0 volts) which turns on source transistor 12A enabling the pFET pull-up path, while the switching inverter 18 outputs a logic low which turns off source transistor 14B disabling the nFET pull-down path. With the pull-up path enabled and the pull-down path disabled, the application of vBIASP to the gate terminal of transistor 12B causes the desired drain current (e.g., about 8 mA) to be sourced by the pull-up path.

Conversely, when signal IN_N is a logic low and thus signal IN_P is also a logic low, the switching inverter 18 outputs a logic high which turns on source transistor 14B enabling the nFET pull-down path, while the switching inverter 16 outputs a logic high which turns off source transistor 12A disabling the pFET pull-up path. With the pull-down path enabled and the pull-up path disabled, the application of vBIASN to the gate terminal of transistor 14A causes the desired drain current (e.g., about 8 mA) to be sunk by the pull-down path.

Figure 3A:
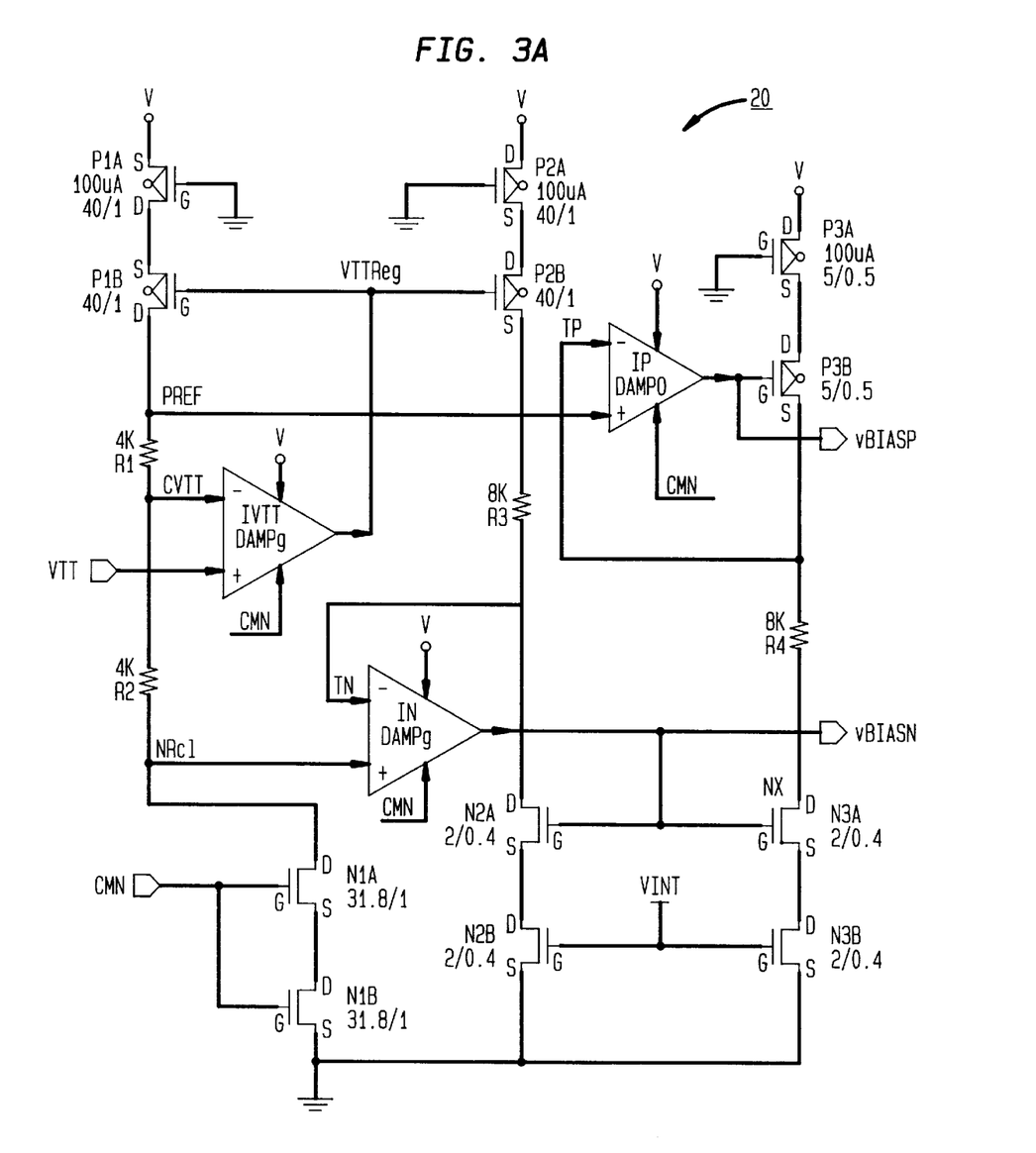
FIG. 3A is a schematic diagram of one embodiment of a bias generator of an output driver circuit of the present invention.

Referring now to FIG. 3A, a first embodiment of a bias generator 20 for generating the bias voltages vBIASP and vBIASN is shown. It is to be appreciated that the bias generator 20 is preferably formed by three interconnected stages, as will be explained. The voltages applied to the bias generator circuit in order to generate vBIASP and vBIASN include an internal power supply voltage, denoted as VINT; a band gap reference voltage, denoted as CMN; and the reference voltage VTT of the external termination resistor 22 (FIG. 2). It is to be understood that CMN (band gap reference) is a highly precise constant reference voltage which guarantees current flow through the first stage of the bias generator circuit as a function of the external reference voltage VTT, as will be explained.

Thus, the first stage consists of a dual gate pFET transistor device consisting of source transistor P1A serially connected to drain transistor P1B. The dual gate pFET device P1A/P1B is serially connected between a voltage source V (i.e., same as the voltage source connected to transistor 12A (FIG. 2)) and resistor R1. Resistor R1 is serially connected to resistor R2. The first stage also consists of a dual gate nFET transistor device consisting of source transistor N1B serially connected to drain transistor N1A. The dual gate nFET device N1A/N1B is serially connected between ground and resistor R2. The first stage also consists of a first operational amplifier IVTT having an inverting terminal connected to a junction between resistors R1 and R2 and a non-inverting terminal connected to VTT. The output terminal of first operational amplifier IVTT is connected to the gate terminal of the drain transistor P1B. The gate terminal of the source transistor P1A is connected to ground. The gate terminals of both the source transistor N1B and drain transistor N1A are connected to CMN.

The second stage consists of a dual gate pFET transistor device, similar to pFET device P1A/P1B in the first stage, consisting of source transistor P2A serially connected to drain transistor P2B. The dual gate pFET device P2A/P2B is serially connected between the voltage source V and resistor R3. The second stage also consists of a dual gate nFET transistor device consisting of source transistor N2B serially connected to drain transistor N2A. The dual gate nFET device N2A/N2B is serially connected between ground and resistor R3. The second stage also consists of a second operational amplifier IN having an inverting terminal connected to a junction between resistor R3 and nFET device N2A/N2B and a non-inverting terminal connected to a junction between resistor R2 and nFET device N1A/N1B (first stage).

The output terminal of the second operational amplifier IN is connected to the gate terminal of the drain transistor N2A. The gate terminal of the source transistor N2B is connected to internal voltage power supply VINT. It is to be appreciated that the voltage VINT is preferably less than or equal to the voltage V. The gate terminal of the pFET source transistor P2A is connected to ground, while the gate terminal of P2B is connected to the output terminal of the first operational amplifier IVTT. As will be explained, the output terminal of the second operational amplifier IN also provides the bias voltage vBIASN to the pull-down path of the output driver circuit.

The third stage consists of a dual gate pFET transistor device consisting of source transistor P3A serially connected to drain transistor P3B. The dual gate pFET device P3A/P3B is serially connected between the voltage source V and resistor R4. The third stage also consists of a dual gate nFET device, similar to the nFET device N2A/N2B (second stage), consisting of source transistor N3B serially connected to drain transistor N3A. The dual gate nFET device N3A/N3B is serially connected between ground and resistor R4. The third stage also consists of a third operational amplifier IP having an inverting terminal connected to a junction between resistor R4 and pFET device P3A/P3B and a non-inverting terminal connected to a junction between resistor R1 and pFET device P1A/P1B (first stage). The output terminal of the third operational amplifier IP is connected to the gate terminal of the drain transistor P3B. The gate terminal of the source transistor P3A is connected to ground.

The gate terminal of the nFET source transistor N3B is connected to VINT, while the gate terminal of N3A is connected to the output terminal of the second operational amplifier IN. As will be explained, the output terminal of the third operational amplifier IP also provides the bias voltage vBIASP to the pull-up path of the output driver circuit. Given such preferred connectivity between components in the three stages, the operation of the bias generator 20 will now be explained.

The provision of voltage CMN to the nFET device N1A/N1B permits a current to flow through the first stage, e.g., 100 microamps ($\mu$A). The current through the first stage causes a voltage drop across the resistors R1 and R2. It is to be appreciated that the values of the resistors R1 and R2 are chosen to correspond to the external termination resistor 22 (FIG. 2). That is, referring to the earlier example where the termination resistor 22 is preferably 50 ohms and the current to be sourced or sunk by the output driver circuit is about 8 mA, and assuming that the current through the first stage is about 100 $\mu$A, the values of R1 and R2 are preferably chosen to be 4K ohms.

Thus, assuming that about a 400 mV voltage drop is required across the 50 ohm termination resistor (in order to satisfy the input voltage requirement of the receiver), a corresponding voltage drop of about 400 mV is required across each resistor R1 and R2, respectively. The voltage drop across R1 is denoted as PREF, while the voltage drop across R2 is denoted as NREF.

Voltage VTT, the external reference voltage of the termination resistor 22, is provided to the operational amplifier IVTT along with the voltage between R1 and R2, i.e., CVTT, in order to regulate VTT before it is provided to the gate terminals of drain transistors P1B and P2B. That is, any variations in the external reference voltage VTT are compensated for by operational amplifier IVTT such that IVTT outputs a regulated VTT voltage, i.e., VTTReg. Voltage VTTReg is provided to both the gate terminals of the drain transistors P1B (first stage) and P2B (second stage) in order to permit current flow through the respective stages of the bias generator circuit. It is to be understood that dual gate pFET device P1A/P1B and dual gate pFET device P2A/P2B form a current mirror circuit such that the same current that flows through the P1A/P1B device also flows through the P2A/P2B device, e.g., 100 $\mu$A.

It is to be appreciated that each transistor has a channel width and channel length (denoted as a width/length ratio) associated therewith. The units of measure are not shown but are preferably in micrometers ($\mu$m). Such characteristics of the transistors substantially determine the capacity of the transistor. Thus, in order for the P2A/P2B device to mirror the P1A/P1B device, their width/length ratios are selected to be substantially equal, e.g., 40/1.

Further, voltage NRef (e.g., VTT-400 mV) is provided to the operational amplifier IN along with the voltage at the junction between R3 and dual gate nFET device N2A/N2B, i.e., TN. In response to such inputs, the operational amplifier IN generates n-channel bias voltage vBIASN which is provided to the drain transistor 14A (FIG. 2) of the output driver circuit. In addition, the output of the operational amplifier IN is provided to the gate terminals of drain transistors N2A and N3A. The dual gate nFET device N2A/N2B and dual gate nFET device N3A/N3B form a current mirror circuit such that the same current that flows through the N2A/N2B device also flows through the N3A/N3B device, e.g., 100 $\mu$A. Thus, in order for the N3A/N3B device to mirror the N2A/N2B device, their width/length ratios are selected to be substantially equal, e.g., 2/0.4.

However, it is important to note that the channel width/length ratio of the N2A/N2B device (and, thus, the N3A/N3B device) is selected to correspond to the channel width/length ratio of the dual gate nFET device 14 of the output driver circuit. That is, the channel length of each transistor (both source and drain transistors) is selected to be substantially equal among the transistors, e.g., 0.4. However, the channel width of transistors N2A, N3A, N2B and N3B is selected to be proportional to the channel width of transistors 14A and 14B, the proportionality being equivalent to the proportionality desired between the respective current flowing through the devices. Accordingly, assuming the current to be sunk by nFET device 14 is about 8 mA and a channel width for each transistor 14A and 14B is selected to be 160, and assuming the current flowing through the N2A/N2B device (and, thus, the N3A/N3B device) is about 100 $\mu$A, then the channel width of the transistors of the N2A/N2B and N3A/N3B devices is selected to be 2 (i.e., 160/2=80 and 80×100 $\mu$A=8 mA).

Still further, voltage PRef (e.g., VTT+400 mV) is provided to the operational amplifier IP along with the voltage at the junction between R4 and dual gate pFET device P3A/P3B, i.e., TP. In response to such inputs, the operational amplifier IP generates p-channel bias voltage vBIASP which is provided to the drain transistor 12B (FIG. 2) of the output driver circuit. In addition, the output of the operational amplifier IP is provided to the gate terminal of drain transistor P3B.

Similar to the correspondence of the channel width/length ratio of the N2A/N2B and N3A/N3B devices with the dual gate nFET device 14, the channel width/length ratio of the P3A/P3B device corresponds to that of the dual gate pFET device 12 of the output driver circuit. Thus, the channel length of each transistor (both source and drain transistors) is selected to be substantially equal among the transistors, e.g., 0.5, while the channel width of transistors P3A and P3B is selected to be proportional to the channel width of transistors 12A and 12B, the proportionality being equivalent to the proportionality desired between the respective current flowing through the devices. Accordingly, assuming the current to be sourced by the pFET device 12 is about 8 mA and a channel width for each transistor 12A and 12B is selected to be 400, and assuming the current flowing through the P3A/P3B device is about 100 $\mu$A, then the channel width of the transistors of the P3A/P3B device is selected to be 5 (i.e., 400/5 is equal to 80 and 80×100 $\mu$A=8 mA).

It is to be appreciated that the resistors R3 and R4 are provided respectively in the second and third stages of the bias generator circuit in order to provide a voltage drop at the source and drain of the n-channel and p-channel transistors in each stage which is equivalent to the voltage drop provided by the serial combination of resistors R1 and R2 in the first stage. Thus, assuming that R1 and R2 are each 4K ohms (thus a serial combination of 8K ohms), R3 and R4 are each chosen to preferably be 8K ohms. Also, it is important to note that the signals IN_P and IN_N discussed in the context of FIG. 2 are provided by VINT. It is to be appreciated that if VINT is smaller than V, then a level shifter is required to gate the input of transistors 12A instead of inverter 16 so as to ensure a high (V) at the gate of 12A. If V is equal to VINT, then the power supply of inverter 16 can be connected to V or VINT. But, as mentioned above, if V is higher than VINT, then inverter 16 has to be connected to V (or a level shifter employed) otherwise transistor 12A would not turn off properly. Inverter 18 can be connected to V or VINT. It should also be noted that the bias voltage vBIASN is not a perfectly constant voltage. That is, vBIASN varies with the external reference voltage VTT and also with process tolerances and temperature. The bias voltage vBIASP also varies as a function of these factors but, in addition, varies with the power supply voltage V of the chip on which the output driver circuit is formed.

Figure 3B:
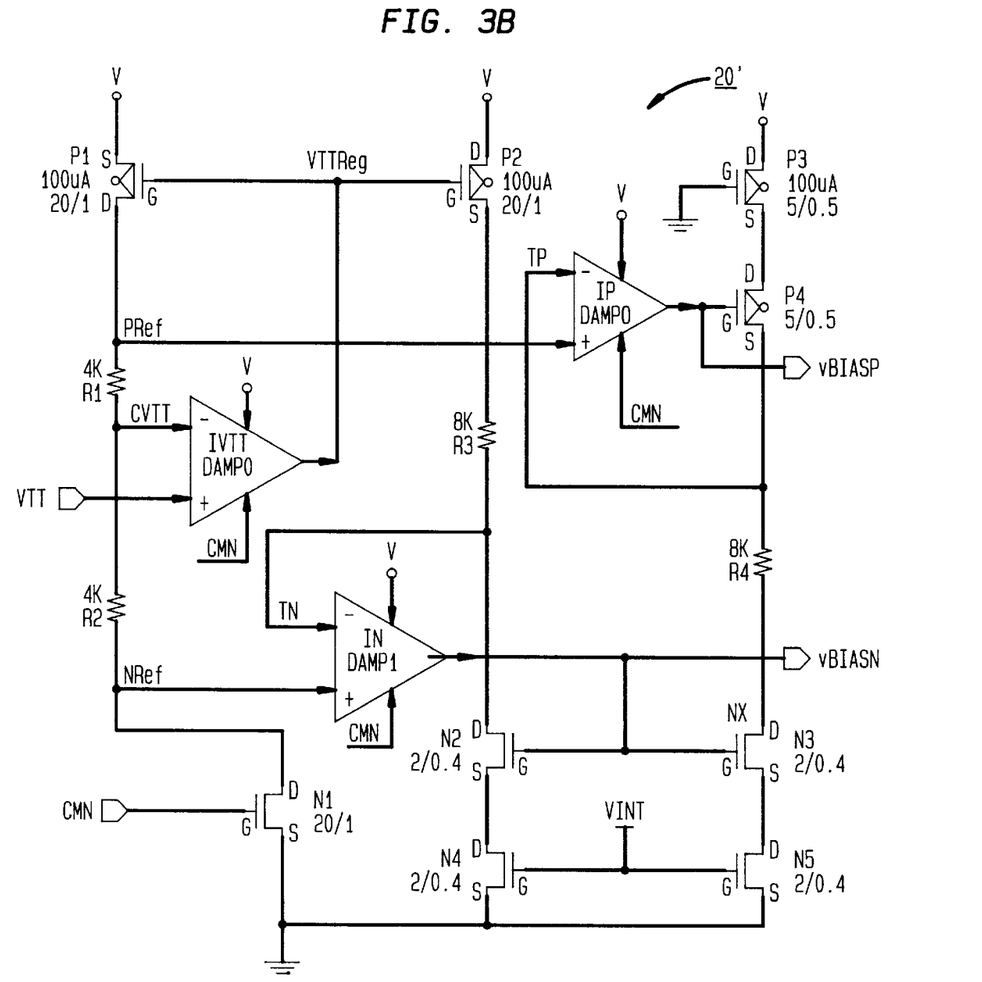
FIG. 3B is a schematic diagram of an alternative embodiment of the output driver circuit shown in FIG. 3A.

Referring to FIG. 3B, an alternative embodiment of the bias generator 20 is shown. It is to be understood that a bias generator 20' is substantially similar to the bias generator 20 of FIG. 3A, with the only exception being that dual gate transistor devices P1A/P1B, P2A/P2B and N1A/N1B are respectively replaced by single transistor devices P1, P2 and N1. The use of the dual gate transistors P1A/P1B, P2A/P2B and N1A/N1B is preferable, particularly when the power supply V is higher than the internal power supply VINT such that the internal circuitry may share/distribute the voltage across such transistors. Otherwise, the bias generator 20' operates exactly the same as the bias generator 20 explained in the context of FIG. 3A.

It is to be appreciated that the above example describes operation wherein about 8 mA is sourced and sunk by the output driver of the present invention with respect to a termination resistor 22 of about 50 ohms. However, if the termination resistor is about 25 ohms and the output driver circuit sources and sinks about 16 mA, the channel widths of transistors 12A and 12B and transistors 14A and 14B would be different. Thus, to maintain the proportionality with the transistors previously described in the bias generator circuit, the channel widths of transistors 12A and 12B would be 800, and the channel widths of transistors 14A and 14B would be 320.

Figure 4A:
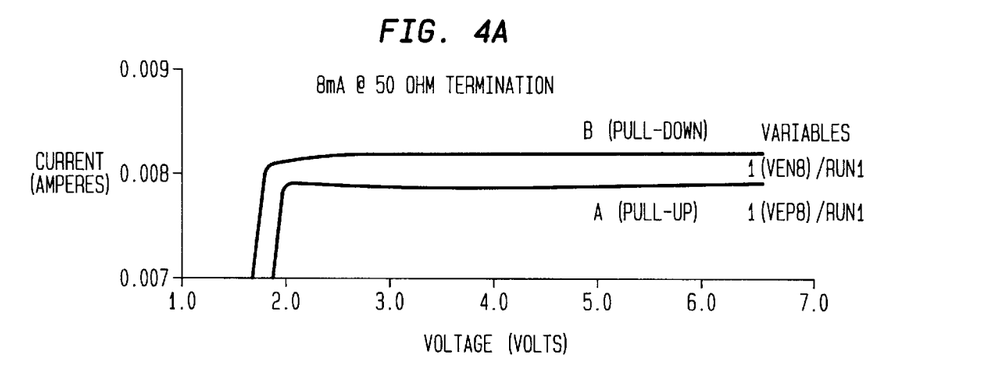
FIGS. 4A and 4B are graphical representations of the output current of output driver circuits of the present invention.
Figure 4B:
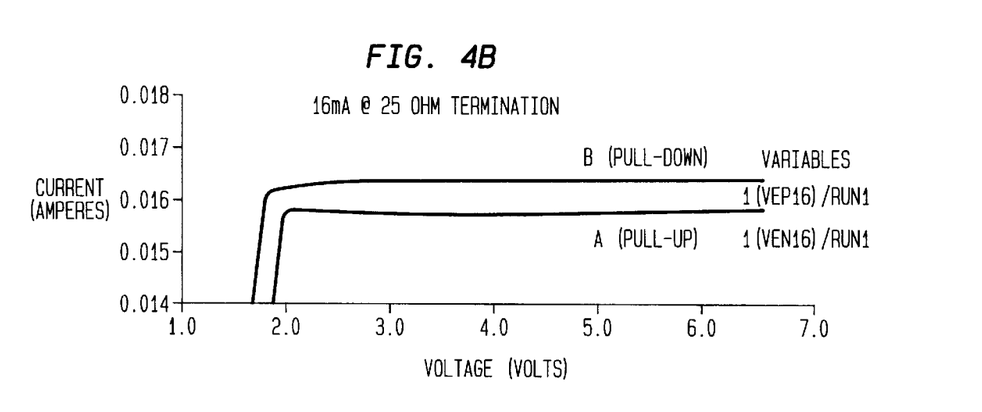

Graphical representations of examples of the output current for both the pull-up path (curve labeled A) and the pull-down path (curve labeled B) of the output driver circuit 10 of the invention for a 50 ohm termination (8 mA) are shown in FIG. 4A and for a 25 ohm termination (16 mA) are shown in FIG. 4B. The current curves in FIG. 4A illustrate the example described herein where about an 8 mA current is desired to be alternately sourced and sunk by the output driver circuit of the invention. A similar example for a 16 mA embodiment is shown in FIG. 4B.

Figure 5:
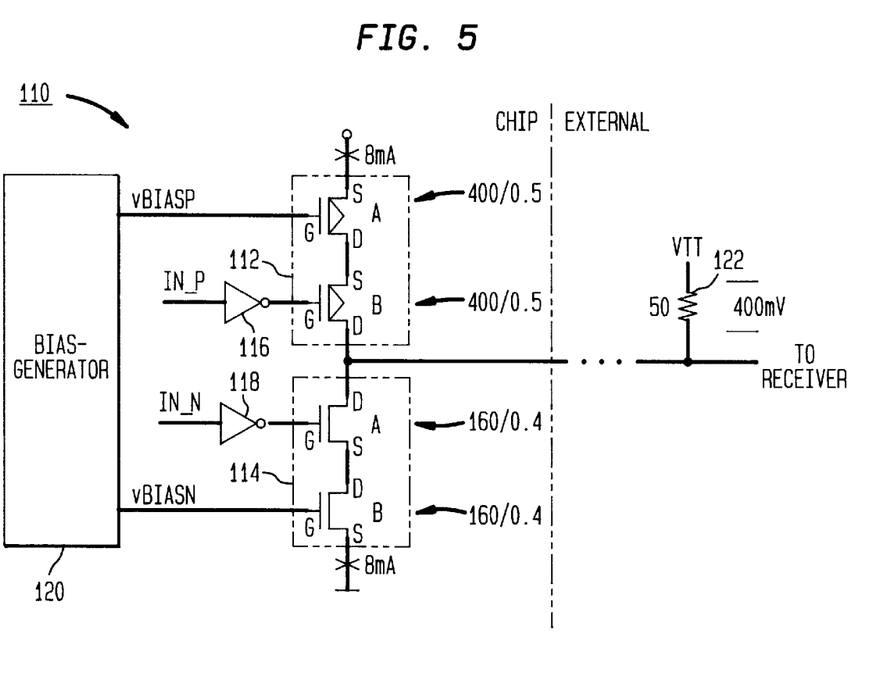
FIG. 5 is a schematic diagram of another embodiment of an output driver circuit of the present invention.

Referring now to FIG. 5, a second embodiment of an output driver circuit according to the invention for providing constant drain current control to a resistive termination load is illustrated. Again, such an output driver circuit of the invention is preferably employed as an off chip driver (OCD) in a semiconductor memory device, e.g, a DRAM device. The output driver circuit 110 is substantially similar to the output driver circuit 10 (FIG. 2) and as such, all reference numerals associated with components in FIG. 5 are the same as the reference numerals associated with similar components in FIG. 2, except that they are incremented by 100.

The main difference between the output driver circuit 110 and the output driver circuit 10 is that the functions performed by the respective drain and source transistors of the dual gate pFET and nFET devices are exchanged. That is, instead of the source transistors 112A (of pFET device 112) and 114B (of nFET device 114) being respectively connected to switching inverters to enable and disable the pull-up and pull-down paths, and instead of the drain transistors 112B (of pFET device 112) and 114A (of nFET device 114) being connected to a bias generator; the source transistors 112A and 114B in circuit 110 are connected to a bias generator 120, while the drain transistors 112B and 114A are respectively connected to switching inverters 116 and 118. Accordingly, the drain transistors in circuit 110 perform the path enabling/disabling function and the source transistors perform the constant current control function. It is to be appreciated that such an alternative arrangement, while providing a similar functional result as circuit 10, also serves to improve the input capacitance of the output driver circuit in the high impedance state of the output driver circuit. In other words, in the high impedance state (when both the pull-up and pull-down output transistors are turned off), the output driver circuit has a certain capacitance at the output node. The amount of capacitance depends on the diffusion area (junctions of transistors 12 and 14) and the area toward the gate of the output transistors. The arrangement in FIG. 2, the switching transistors are at the source side of the dual gate transistors and the drain transistors (connected to vBIASP and vBIASN) are turned on. The junction and the gate area at the output node (labelled "to receiver") is relatively high and so is the capacitance associated therewith. However, in the arrangement of FIG. 5, the gate area is much smaller because both drain transistors of the dual gate transistor devices are turned off in the high impedance state and the junction area at the output node is limited to the drains of both transistors. As a result, the capacitance at the output node of circuit 110 is relatively smaller than the capacitance at the output of circuit 10. Nonetheless, assuming the same termination resistance of 50 ohms for termination resistor 122, and assuming the input voltage of the receiver (not shown) is about +/−400 mV, the pull-up path (pFET device 112) preferably sources about 8 mA and the pull-down path (nFET device 114) preferably sinks about 8 mA.

Figure 6A:
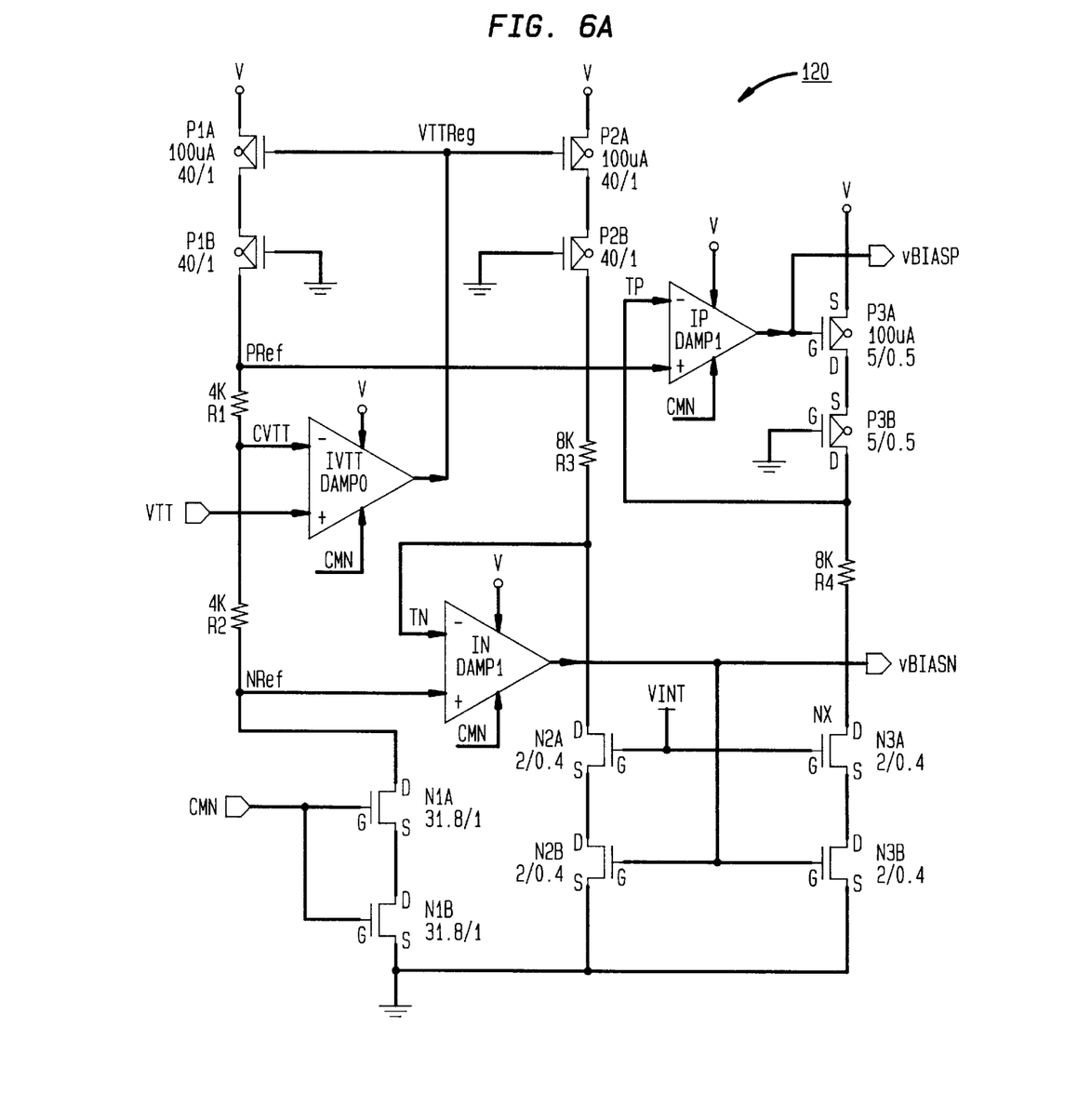
FIG. 6A is a schematic diagram of another embodiment of a bias generator of an output driver circuit of the present invention.

FIG. 6A illustrates details of a preferred form of the bias generator 120. It is to be appreciated that bias generator 120 is also substantially similar to bias generator 20 (FIG. 3A), except that, similar to the respective functions of the drain and source transistors of devices 112 and 114 being exchanged as compared to devices 12 and 14 of circuit 10, each source and drain transistor function is exchanged within the pFET and nFET devices in bias generator 120. In fact, the reference numerals and voltage designations used in bias generator 120 are the same as those used in bias generator 20. Accordingly in bias generator 120, the output terminal of the first operational amplifier IVTT is connected to the respective gate terminals of P1A and P2A, while the respective gate terminals of P2B and P1B are grounded. Further, in bias generator 120, the output terminal of the second operational amplifier IN is connected to the respective gate terminals of N2B and N3B, while the respective gate terminals of N2A and N3A are connected to VINT. Still further, the output terminal of the third operational amplifier IP is connected to the gate terminal of P3A, while the gate terminal of P3B is grounded. Otherwise, vBIASP and vBIASN are generated in exactly the same manner as described above with respect to bias generator 20.

Figure 6B:
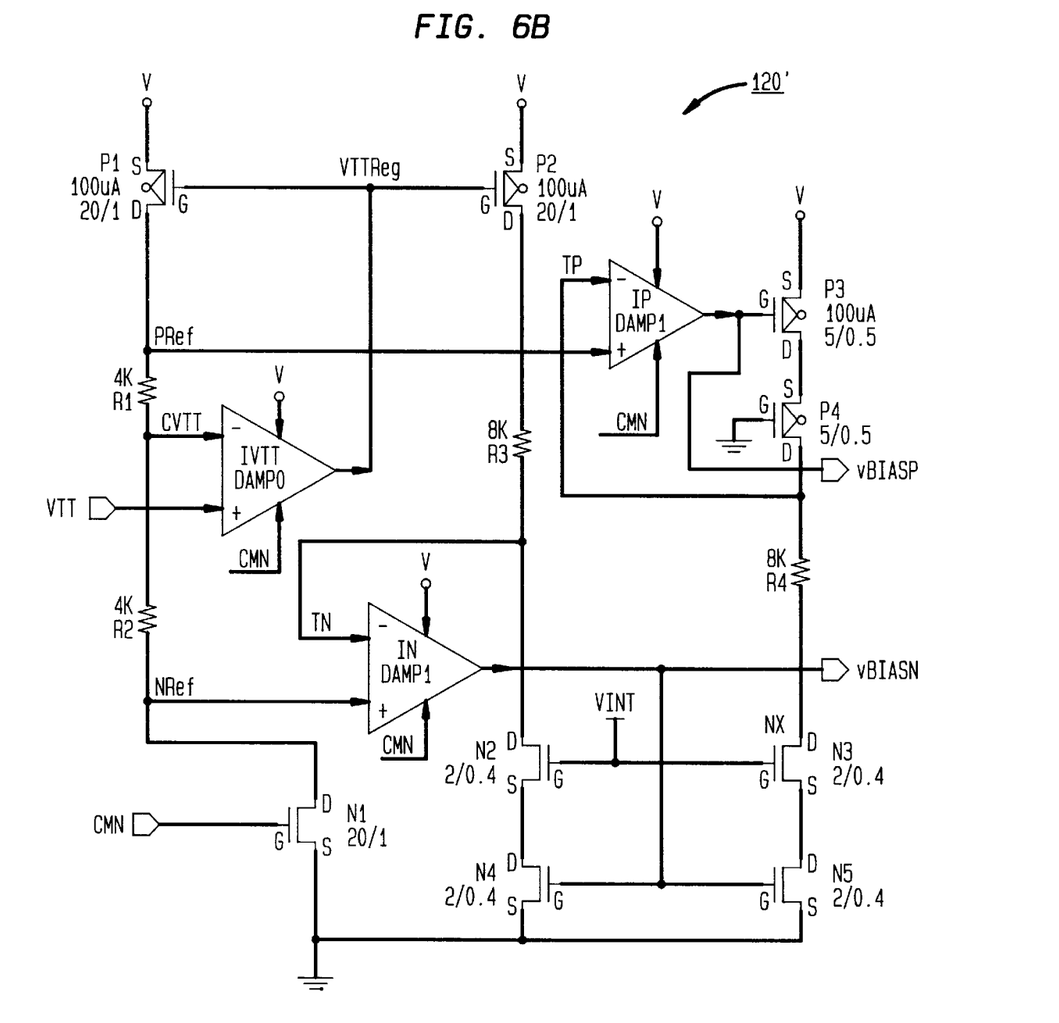
FIG. 6B is a schematic diagram of an alternative embodiment of the output driver circuit shown in FIG. 6A.

Referring now to FIG. 6B, similar to the relationship between bias generator circuit 20 (FIG. 3A) and bias generator circuit 20' (FIG. 3B), the alternative bias generator circuit 120' is substantially similar to bias generator circuit 120 except that single transistors P1, P2 and N1 respectively replace dual gate transistor devices P1A/P1B, P2A/P2B and N1A/N1B for the same reason explained above for circuits 20 and 20'. Thus, the output of circuit 120' is exactly the same as that of circuit 120.

Figure 7A:
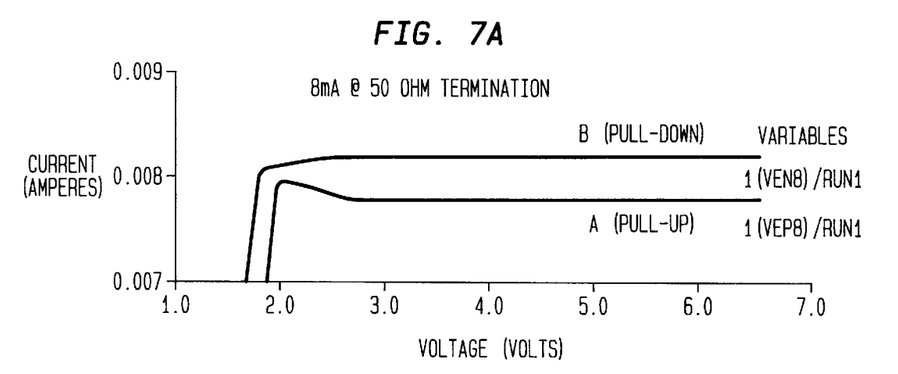
FIGS. 7A and 7B are graphical representations of the output current of output driver circuits of the present invention.
Figure 7B:
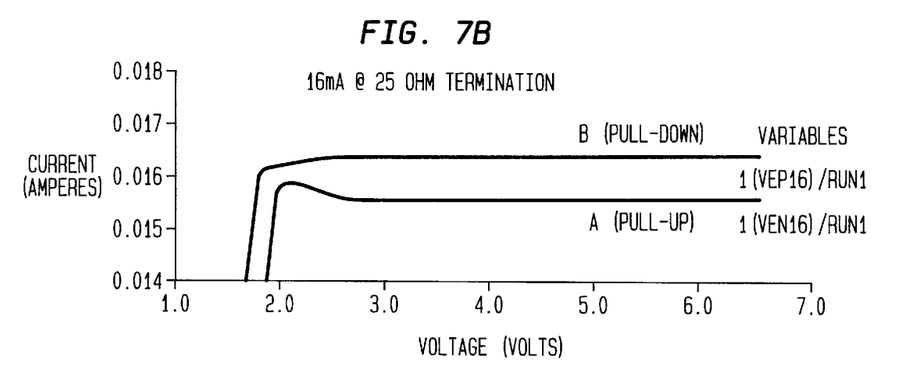

Similar to FIGS. 4A and 4B, graphical representations of examples of the output current for both the pull-up path (curve labeled A) and the pull-down path (curve labeled B) of the output driver circuit 110 of the invention are shown in FIGS. 7A and 7B. The current curves in FIG. 7A illustrate the example described herein where about an 8 mA current (50 ohm terminator) is desired to be alternately sourced and sunk by the output driver circuit of the invention while the current curves in FIG. 7B illustrate a 16 mA (25 ohm terminator) example.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. An output driver circuit having an output terminal operatively coupled to a resistive termination load, the circuit comprising:

a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit;

a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit;

first switch, operatively coupled to the gate terminal of the source transistor of the dual gate pFET device, for turning on and off current flow from the voltage source V through the source transistor of the dual gate pFET device;

second switch, operatively coupled to the gate terminal of the source transistor of the dual gate nFET device, for turning on and off current flow to the ground potential through the source transistor of the dual gate nFET device; and bias generator having a first output terminal operatively coupled to the gate terminal of the drain transistor of the dual gate pFET device and providing a first bias voltage to the drain transistor which is a function of a reference voltage associated with the resistive termination load and which substantially controls the amount of current provided by the drain transistor of the dual gate pFET device to the resistive termination load, the bias generator also having a second output terminal operatively coupled to the gate terminal of the drain transistor of the dual gate nFET device and providing a second bias voltage to the drain transistor which is a function of the reference voltage associated with the resistive termination load and which substantially controls the amount of current provided by the resistive termination load to the drain transistor of the dual gate nFET device.

2. The output driver circuit of claim 1, wherein the first switch includes a switching inverter.

3. The output driver circuit of claim 1, wherein the second switch includes a switching inverter.

4. The output driver circuit of claim 1, wherein the source and drain transistors are CMOS transistors.

5. An output driver circuit having an output terminal operatively coupled to a resistive termination load, the circuit comprising:

a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit;

a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit;

first switch, operatively coupled to the gate terminal of the source transistor of the dual gate pFET device, for turning on and off current flow from the voltage source V through the source transistor of the dual gate pFET device;

second switch, operatively coupled to the gate terminal of the source transistor of the dual gate nFET device, for turning on and off current flow to the ground potential through the source transistor of the dual gate nFET device; and bias generator having a first output terminal operatively coupled to the gate terminal of the drain transistor of the dual gate pFET device and providing a first bias voltage to the drain transistor which is a function of a reference voltage associated with the resistive termination load and which substantially controls the amount of current provided by the drain transistor of the dual gate pFET device to the resistive termination load, the bias generator also having a second output terminal operatively coupled to the gate terminal of the drain transistor of the dual gate nFET device and providing a second bias voltage to the drain transistor which is a function of the reference voltage associated with the resistive termination load and which substantially controls the amount of current provided by the resistive termination load to the drain transistor of the dual gate nFET device, wherein the bias generator further comprises a first stage including:

an nFET device responsive to a first voltage source and permitting a current flow through the first stage;

an operational amplifier responsive to the reference voltage associated with the resistive termination load and the current flow through the first stage and regulating variations associated with the reference voltage;

a pFET device responsive to the regulated reference voltage and permitting a current flow through the first stage;

a first resistor responsive to the current flow through the first stage and providing a first voltage drop thereacross; and a second resistor responsive to the current flow through the first stage and providing a second voltage drop thereacross.

6. The output driver circuit of claim 5, wherein the pFET device further includes a source transistor serially connected to a drain transistor, each transistor having a gate terminal, the gate terminal of the source transistor being grounded and the gate terminal of the drain transistor being connected to the regulated reference voltage.

7. The output driver circuit of claim 5, wherein the nFET device further includes a source transistor serially connected to a drain transistor, each transistor having a gate terminal, the gate terminals of the source and drain transistors being connected to the first voltage source.

8. The output driver circuit of claim 5, wherein the first voltage source is a band gap reference voltage source.

9. The output driver circuit of claim 5, wherein the bias generator further comprises a second stage including:

a pFET device responsive to the regulated reference voltage and permitting a current flow through the second stage which is substantially equivalent to the current flow through the first stage;

an operational amplifier responsive to the voltage drop across the second resistor of the first stage and the current flow through the second stage;

an nFET device responsive to the operational amplifier and an internal voltage source and permitting current flow through the second stage; and a resistor responsive to the current flow through the second stage and providing a voltage drop substantially equivalent to the sum of the voltage drops across the first and second resistors of the first stage;

wherein the second operational amplifier generates the first bias voltage.

10. The output driver circuit of claim 9, wherein the pFET device further includes a source transistor serially connected to a drain transistor, each transistor having a gate terminal, the gate terminal of the source transistor being grounded and the gate terminal of the drain transistor being connected to the regulated reference voltage.

11. The output driver circuit of claim 9, wherein the nFET device further includes a source transistor serially connected to a drain transistor, each transistor having a gate terminal, the gate terminal of the source transistor being connected to the internal voltage source and the gate terminal of the drain transistor being connected to the second bias voltage.

12. The output driver circuit of claim 9, wherein the bias generator further comprises a third stage including:

an nFET device responsive to the second stage operational amplifier and the internal voltage source and permitting current flow through the third stage;

an operational amplifier responsive to the first voltage drop across the first resistor of the first stage and the current flow through the third stage;

a pFET device responsive to the third stage operational amplifier and permitting current flow through the third stage; and a resistor responsive to the current flow through the third stage and providing a voltage drop substantially equivalent to the sum of the voltage drops across the first and second resistors of the first stage;

wherein the third operational amplifier generates the second bias voltage.

13. The output driver circuit of claim 12, wherein the pFET device further includes a source transistor serially connected to a drain transistor, each transistor having a gate terminal, the gate terminal of the source transistor being grounded and the gate terminal of the drain transistor being connected to the first bias voltage.

14. The output driver circuit of claim 12, whrein the nFET device further includes a source transistor serially connected to a drain transistor, each transistor having a gate terminal, the gate terminal of the source transistor being connected to the internal voltage source and the gate terminal of the drain transistor being connected to the second bias voltage.

15. An output driver circuit having an output terminal operatively coupled to a resistive termination load, the circuit comprising:

a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit;

a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit;

first switch, operatively coupled to the gate terminal of the drain transistor of the dual gate pFET device, for turning on and off current flow from the source transistor of the dual gate pFET device;

second switch, operatively coupled to the gate terminal of the drain transistor of the dual gate nFET device, for turning on and off current flow to the source transistor of the dual gate nFET device; and bias generator having a first output terminal operatively coupled to the gate terminal of the source transistor of the dual gate pFET device and providing a first bias voltage to the source transistor which is a function of a reference voltage associated with the resistive termination load and which substantially controls the amount of current provided to and through the drain transistor of the dual gate pFET device to the resistive termination load, the bias generating means also having a second output terminal operatively coupled to the gate terminal of the source transistor of the dual gate nFET device and providing a second bias voltage to the source transistor which is a function of the reference voltage associated with the resistive termination load and which substantially controls the amount of current provided by the resistive termination load to and through the drain transistor of the dual gate nFET device.

16. The output driver circuit of claim 15, wherein the first switch includes a switching inverter.

17. The output driver circuit of claim 15, wherein the second switch includes a switching inverter.

18. The output driver circuit of claim 15, wherein the source and drain transistors are CMOS transistors.

19. An output driver circuit having an output terminal operatively coupled to a resistive termination load, the circuit comprising:

a dual gate pFET device including a source transistor and a drain transistor, each transistor respectively having a gate terminal, a source terminal and a drain terminal, the source terminal of the source transistor being operatively coupled to a voltage source V, the drain terminal of the source transistor being operatively coupled to the source terminal of the drain transistor, the drain terminal of the drain transistor being operatively coupled to the output terminal of the output driver circuit;

a dual gate nFET device including a source transistor and a drain transistor, each transistor respectively having a gate terminal, a source terminal and a drain terminal, the source terminal of the source transistor being operatively coupled to a ground potential, the drain terminal of the source transistor being operatively coupled to the source terminal of the drain transistor, the drain terminal of the drain transistor being operatively coupled to the output terminal of the output driver circuit;

first switch, operatively coupled to the gate terminal of the drain transistor of the dual gate pFET device, for turning on and off current flow from the source transistor of the dual gate pFET device;

second switch, operatively coupled to the gate terminal of the drain transistor of the dual gate nFET device, for turning on and off current flow to the source transistor of the dual gate nFET device; and bias generator having a first output terminal operatively coupled to the gate terminal of the source transistor of the dual gate pFET device and providing a first bias voltage to the source transistor which is a function of a reference voltage associated with the resistive termination load and which substantially controls the amount of current provided to and through the drain transistor of the dual gate pFET device to the resistive termination load, the bias generating means also having a second output terminal operatively coupled to the gate terminal of the source transistor of the dual gate nFET device and providing a second bias voltage to the source transistor which is a function of the reference voltage associated with the resistive termination load and which substantially controls the amount of current provided by the resistive termination load to and through the drain transistor of the dual gate nFET device, wherein the bias generating means further comprises a first stage including:

an nFET device responsive to a first voltage source and permitting a current flow through the first stage;

an operational amplifier responsive to the reference voltage associated with the resistive termination load and the current flow through the first stage and regulating variations associated with the reference voltage;

a pFET device responsive to the regulated reference voltage and permitting a current flow through the first stage;

a first resistor responsive to the current flow through the first stage and providing a first voltage drop thereacross; and a second resistor responsive to the current flow through the first stage and providing a second voltage drop thereacross.

20. The output driver circuit of claim 19, wherein the pFET device further includes a source transistor serially connected to a drain transistor, each transistor having a gate terminal, the gate terminal of the drain transistor being grounded and the gate terminal of the source transistor being connected to the regulated reference voltage.

21. The output driver circuit of claim 19, wherein the nFET device further includes a source transistor serially connected to a drain transistor, each transistor having a gate terminal, the gate terminals of the source and drain transistors being connected to the first voltage source.

22. The output driver circuit of claim 19, wherein the first voltage source is a band gap reference voltage source.

23. The output driver circuit of claim 19, wherein the bias generating means further comprises a second stage including:

a pFET device responsive to the regulated reference voltage and permitting a current flow through the second stage which is substantially equivalent to the current flow through the first stage;

an operational amplifier responsive to the voltage drop across the second resistor of the first stage and the current flow through the second stage;

an nFET device responsive to the operational amplifier and an internal voltage source and permitting current flow through the second stage; and a resistor responsive to the current flow through the second stage and providing a voltage drop substantially equivalent to the sum of the voltage drops across the first and second resistors of the first stage;

wherein the second operational amplifier generates the first bias voltage.

24. The output driver circuit of claim 23, wherein the pFET device further includes a source transistor serially connected to a drain transistor, each transistor having a gate terminal, the gate terminal of the drain transistor being grounded and the gate terminal of the source transistor being connected to the regulated reference voltage.

25. The output driver circuit of claim 23, wherein the nFET device further includes a source transistor serially connected to a drain transistor, each transistor having a gate terminal, the gate terminal of the drain transistor being connected to the internal voltage source and the gate terminal of the source transistor being connected to the second bias voltage.

26. The output driver circuit of claim 23, wherein the bias generating means further comprises a third stage including:

an nFET device responsive to the second stage operational amplifier and the internal voltage source and permitting current flow through the third stage;

an operational amplifier responsive to the first voltage drop across the first resistor of the first stage and the current flow through the third stage;

a pFET device responsive to the third stage operational amplifier and permitting current flow through the third stage; and a resistor responsive to the current flow through the third stage and providing a voltage drop substantially equivalent to the sum of the voltage drops across the first and second resistors of the first stage;

wherein the third operational amplifier generates the second bias voltage.

27. The output driver circuit of claim 26, wherein the pFET device further includes a source transistor serially connected to a drain transistor, each transistor having a gate terminal, the gate terminal of the drain transistor being grounded and the gate terminal of the source transistor being connected to the first bias voltage.

28. The output driver circuit of claim 26, wherein the nFET device further includes a source transistor serially connected to a drain transistor, each transistor having a gate terminal, the gate terminal of the drain transistor being connected to the internal voltage source and the gate terminal of the source transistor being connected to the second bias voltage.

* * * * *